United States Patent
Ito

(10) Patent No.: US 8,514,002 B2
(45) Date of Patent: Aug. 20, 2013

(54) CLOCK DELAY ADJUSTMENT CIRCUIT FOR SEMICONDUCTOR INTEGRATED CIRCUIT AND CONTROL METHOD OF THE SAME

(75) Inventor: Yusuke Ito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 233 days.

(21) Appl. No.: 13/079,568

(22) Filed: Apr. 4, 2011

(65) Prior Publication Data

US 2011/0242914 A1 Oct. 6, 2011

(30) Foreign Application Priority Data

Apr. 2, 2010 (JP) ................................ 2010-086359

(51) Int. Cl.
*H03H 11/06* (2006.01)
(52) U.S. Cl.
USPC .......................................... 327/261; 327/291
(58) Field of Classification Search
USPC .......................................... 327/291, 293, 261
See application file for complete search history.

(56) References Cited

U.S. PATENT DOCUMENTS

| 6,743,693 | B2 | 6/2004 | Fujiishi |
| 7,112,984 | B2 | 9/2006 | Ishihara |
| 2003/0232483 | A1 | 12/2003 | Fujiishi |
| 2005/0285615 | A1 | 12/2005 | Ishihara |

FOREIGN PATENT DOCUMENTS

| JP | 2004-022850 | 1/2004 |
| JP | 2006-012046 | 1/2006 |

*Primary Examiner* — Hai L Nguyen
(74) *Attorney, Agent, or Firm* — Young & Thompson

(57) ABSTRACT

A clock signal adjustment circuit in a semiconductor integrated circuit includes: multiple circuit blocks; multiple clock delay circuits supplying delayed clock signals of the input clock signals under the control of the delay control signals to the corresponding circuit blocks; a control circuit conducting a delay test of the circuit blocks; a recovery group memory circuit storing information in the circuit blocks requiring the delay process among the circuit blocks, responsive to the result of the delay test; delay setting circuits storing information about the delay value for circuit blocks requiring the delay process among the circuit blocks, responsive to the result of the delay test; and a delay setting dispatch control circuit dispatching the delay control signal corresponding to the delay value information stored in the delay setting circuit to the clock delay circuits corresponding to the information about the circuit blocks stored in the recovery group memory circuit.

8 Claims, 9 Drawing Sheets

FIG. 6

{
<CHIP #1 RECOVERY WHETHER TO DO OR NOT>
  <CHIP #1 - MACRO GROUP #1 CLOCK DELAY LOWER LIMIT VALUE>
  <CHIP #1 - MACRO GROUP #1 CLOCK DELAY UPPER LIMIT VALUE>
  <CHIP #1 - MACRO GROUP #1 CLOCK RECOVERY WHETHER TO DO OR NOT>
  <CHIP #1 - MACRO GROUP #2 CLOCK DELAY LOWER LIMIT VALUE>
  <CHIP #1 - MACRO GROUP #2 CLOCK DELAY UPPER LIMIT VALUE>
  <CHIP #1 - MACRO GROUP #2 CLOCK RECOVERY WHETHER TO DO OR NOT>
  <CHIP #1 - MACRO GROUP #3 CLOCK DELAY LOWER LIMIT VALUE>
  <CHIP #1 - MACRO GROUP #3 CLOCK DELAY UPPER LIMIT VALUE>
  <CHIP #1 - MACRO GROUP #3 CLOCK RECOVERY WHETHER TO DO OR NOT

<CHIP #2 RECOVERY WHETHER TO DO OR NOT>
  <CHIP #2 - MACRO GROUP #1 CLOCK DELAY LOWER LIMIT VALUE>
  <CHIP #2 - MACRO GROUP #1 CLOCK DELAY UPPER LIMIT VALUE>
  <CHIP #2 - MACRO GROUP #1 CLOCK RECOVERY WHETHER TO DO OR NOT>
  <CHIP #2 - MACRO GROUP #2 CLOCK DELAY LOWER LIMIT VALUE>
  <CHIP #2 - MACRO GROUP #2 CLOCK DELAY UPPER LIMIT VALUE>
  <CHIP #2 - MACRO GROUP #2 CLOCK RECOVERY WHETHER TO DO OR NOT>
  <CHIP #2 - MACRO GROUP #3 CLOCK DELAY LOWER LIMIT VALUE>
  <CHIP #2 - MACRO GROUP #3 CLOCK DELAY UPPER LIMIT VALUE>
  <CHIP #2 - MACRO GROUP #3 CLOCK RECOVERY WHETHER TO DO OR NOT>

·
          ·
          ·

<CHIP #N RECOVERY WHETHER TO DO OR NOT>
  <CHIP #N - MACRO GROUP #1 CLOCK DELAY LOWER LIMIT VALUE>
  <CHIP #N - MACRO GROUP #1 CLOCK DELAY UPPER LIMIT VALUE>
  <CHIP #N - MACRO GROUP #1 CLOCK RECOVERY WHETHER TO DO OR NOT>
  <CHIP #N - MACRO GROUP #2 CLOCK DELAY LOWER LIMIT VALUE>
  <CHIP #N - MACRO GROUP #2 CLOCK DELAY UPPER LIMIT VALUE>
  <CHIP #N - MACRO GROUP #2 CLOCK RECOVERY WHETHER TO DO OR NOT>
  <CHIP #N - MACRO GROUP #3 CLOCK DELAY LOWER LIMIT VALUE>
  <CHIP #N - MACRO GROUP #3 CLOCK DELAY UPPER LIMIT VALUE>
  <CHIP #N - MACRO GROUP #3 CLOCK RECOVERY WHETHER TO DO OR NOT
}

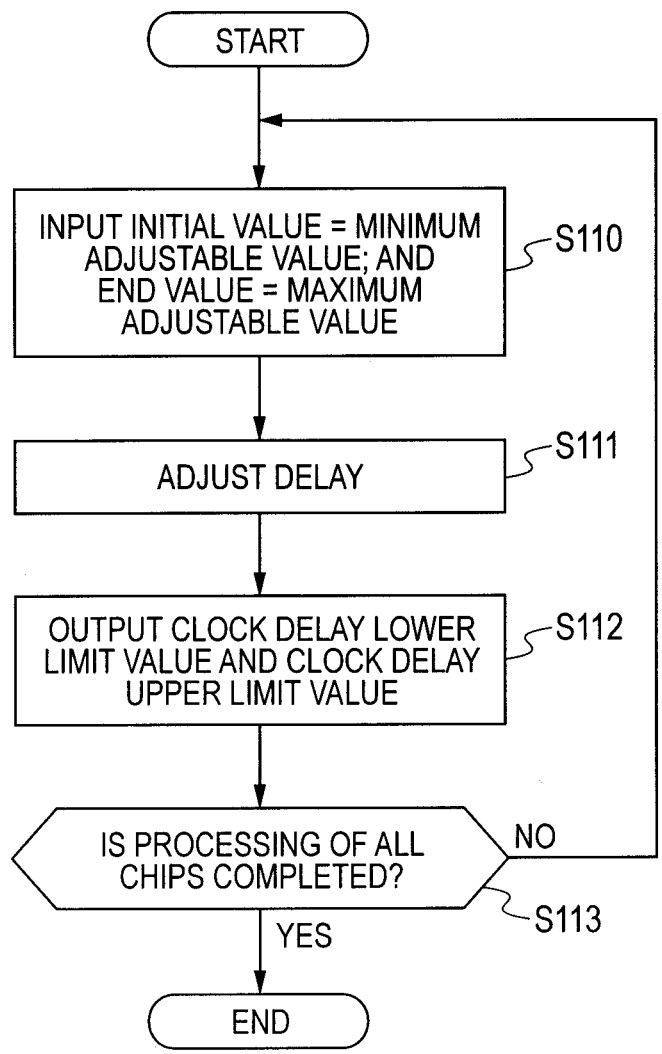

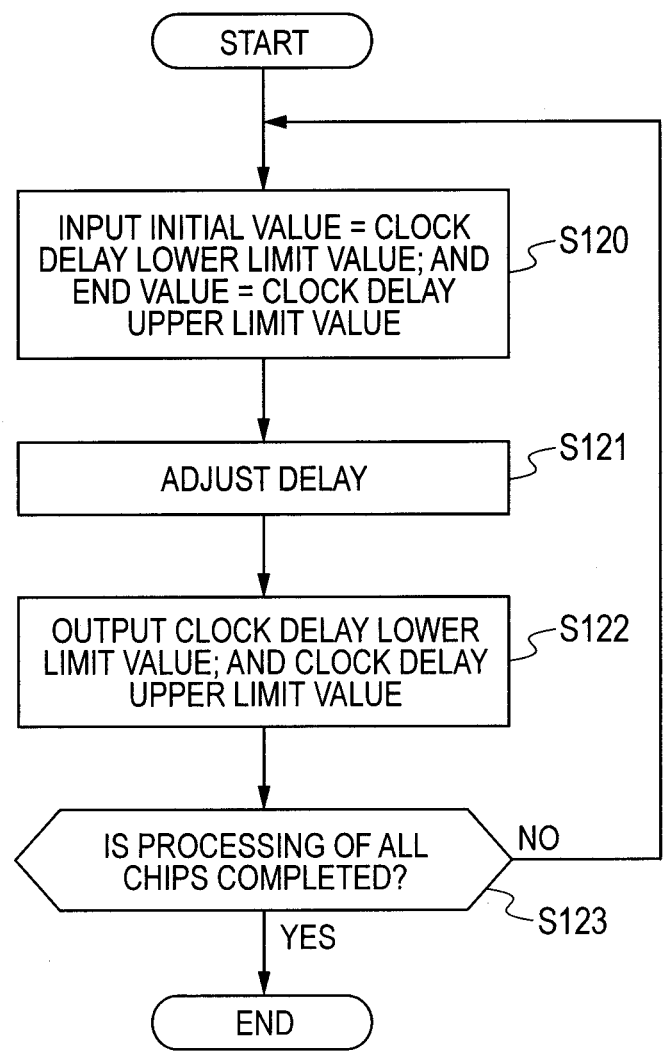

CLOCK DELAY ADJUSTMENT CIRCUIT FOR SEMICONDUCTOR INTEGRATED CIRCUIT AND CONTROL METHOD OF THE SAME

CROSS-REFERENCE TO RELATED APPLICATIONS

The disclosure of Japanese Patent Application No. 2010-86359 filed on Apr. 2, 2010 including the specification, drawings, and abstract is incorporated herein by reference in its entirety.

BACKGROUND

The present invention relates to a clock delay adjustment circuit for a semiconductor IC as well as to the control method of the same.

In recent years, there is increased needs for the manufacturing process of the semiconductor IC to be as finer as possible and thus for the IC to be as faster as possible. Along with this, the increase of the device performance is going not to compensate for the manufacturing yields. The design also is being moved toward a way with the least timing margin as possible, such as the statistical STA method. Because of this there is concern about the decreased yields resulting from the incidents of delay faults, in every part in a chip. Not only a few of specific macros included in a semiconductor IC but also the delay fault recovery of many macros randomly dispersed are being required to be recovered. In the following description, a term "macro" means a functional block which constitutes a part of a semiconductor IC circuit.

An exemplary known related art technology which allows the delay fault recovery is a system LSI 1 that is disclosed in Japanese Patent Application Publication No. Hei18(2006)-12046. FIG. 10 shows a configuration of a system LSI 1. The system LSI 1 includes a logic circuit 10, a ROM 20, a clock delay circuit 30, a delay setting circuit 40, delay adjustment nodes 51 and 52, selectors 43 and 61, a checksum computing circuit 60, and a checksum output node 62.

The logic circuit 10 includes multiple circuit blocks 11 such as a CPU, RAM (not shown in the figure), and an I/O circuit, as well as a clock tree buffer 12.

It should be noted here that the circuit block means a logic circuit component which has its function and circuit pattern predetermined, also referred to as a hard macro. The circuit block may be achieved by appropriately laying out some desired circuit pattern on a semiconductor substrate in accordance with the desired system LSI functionality to be achieved. In addition, trace patterns for signals and power supply to the circuit block is coupled thereto along with providing a clock supply path to each circuit block. By doing this a system LSI having some desired functionalities may be configured.

The logic circuit 10 has a clock signal CK0 fed, which is the base of the operation, and the phase of the clock signal CK0 is adjusted in the clock tree buffer 12 then to feed to each circuit block 11 such as CPU.

For instance, assuming that a circuit block 11 is the CPU (referred to as CPU 11 hereinafter), the clock node C of the CPU 11 will receive a clock signal CK2 from the last output of the clock tree buffer 12.

From the intermediate node of the clock tree buffer 12, the clock signal CK1 is provided for feeding to a specific circuit block 20 such as ROM (referred to as ROM 20 hereinafter) under the test in this system LSI. It should be noted that the clock signal CK1 is provided through the clock delay circuit 30.

The clock delay circuit 30 includes multiple delay elements (DL) 31a to 31c connected in series, and a selector 32. The clock delay circuit 30 will output as delayed clock signal DCK the clock signal delayed in these delay elements 31a to 31c in accordance with the designation by the delay adjustment signal DCN.

The delayed clock signal DCK is provided to the clock node C of the ROM 20. The ROM 20 stores any programs to be executed by the CPU 11 or the static data, and reads out the storage contents of the region specified by the addressing signal AD to be outputted as the data RD.

The delay setting circuit 40 stores any appropriate amount of delay adjustment for the clock delay circuit 30, obtained in the test after manufacturing process. For example, multiple series circuits each made of a fuse 41 and a resistance 42 are coupled in parallel between the power supply potential VDD and the ground potential GND, and whether the fuse 41 is connected or disconnected is provided as the delay setting signal DST from the intersection of the fuse 41 and the resistor 42.

The delay setting signal DST is fed to the input terminal A of the selector 43. In addition, the delay adjustment signal DAD from the delay adjustment node 51 is fed to the input terminal B of the selector 43. The selector 43 selects the input terminal A when the normal operation mode is specified by the mode signal MOD provided from the mode designation node 52, while it selects the input terminal B when the test operation mode is specified. Thus selected signal is outputted to the clock delay circuit 30 from the output terminal Q as the delay adjustment signal DCN.

The checksum computing circuit 60 and the selector 61 perform the test after manufacturing process of the system LSI 1. The checksum computing circuit 60 outputs, in response to the clock signal CK2 provided to the clock node C, the address signal ADT sequentially increasing from 0. In addition, along therewith, the read data RD read from each address of the ROM 20 is cumulatively added (with any carry of digit being neglected), and then the result is outputted to the checksum output terminal 62 as the checksum SUM.

Address signal ADT of the checksum computing circuit 60 is fed to the input terminal B of the selector 61. The input terminal A of the selector 61 is provided with the address signal ADR from the CPU 11, then the address signal AD from the output terminal Q of the selector 61 is in turn fed to the ROM 20. The read data RD output from the ROM 20 is provided to both the CPU 11 and the checksum computing circuit 60.

Hereinafter the test adjustment process just after the manufacturing of the system LSI 1 will be described. At first, a test jig such as an LSI tester is coupled to the delay adjustment node 51, the mode designation node 52 and the checksum output node 62, then the mode signal MOD is set to the test operation mode (for example, level "H"). By doing this the input terminal B is selected in the selectors 43 and 61, the delay adjustment signal DAD which is provided from the delay adjustment node 51 will be outputted to the clock delay circuit 30 as the delay adjustment signal DCN. The address signal ADT which is outputted from the checksum computing circuit 60 will be fed to the ROM 20 as the address signal AD.

Next, by setting the delay adjustment signal DAD to 0, a predetermined clock signal CK0 is fed. In correspondence with the address signal ADT sequentially output from the checksum computing circuit 60, the memory contents of the ROM 20 corresponding thereto will be thereby read out and output as the read data RD. In the checksum computing circuit 60 the read data RD sequentially fetched will be cumulatively added so as to output the result as the checksum SUM.

Then, at the point of the time when the checksum SUM for the all storage contents of the ROM 20 is outputted, the value of the checksum SUM will be determined whether to be correct or not in comparison with the value previously calculated based on the storage contents of the ROM 20. Such test using the checksum is performed for one value after another of the adjustable delay adjustment signal DAD. At the time when a correct checksum is obtained, the value of the delay adjustment signal DAD providing the correct value is set to the delay setting circuit 40 as the cut/uncut status of the fuse 41.

As can be appreciated from the foregoing description, a system LSI having passed the test adjustment after the manufacturing process will be used in a device. At this time, the mode designation node 52 will be fixedly coupled to the state level "L" so as to designate the normal operation mode. Since, in this normal mode, the delay setting signal DST being set in the delay setting circuit 40 is fed to the clock delay circuit 30 as the delay adjustment signal DCN, the clock delay circuit 30 outputs a delayed clock signal DCK having some appropriate delay time to feed to the ROM 20. The address signal ADR output from the CPU 11 will be provided as the address signal AD to the ROM 20.

As described above, the system LSI 1 in accordance with the first embodiment has the clock delay circuit 30 and the checksum computing circuit 60 for adjusting, after manufacturing process, the delay time of the clock signal for the ROM 20, as well as the delay setting circuit 40 for storing the adjusted value. In such configuration, even if the clock signal timing is skewed from the designate value due to the dispersion in the manufacturing process, the product after the manufacturing process can be compensated for the clock signal timing accordingly; therefore, such malfunction as the incorrect operation due to the operation noises or the error operation due to the discrepancy of the clock timings may be suppressed, in order to have an advantage for avoiding the incidental occurrence of defective products.

In addition, there is another technology in accordance with Japanese Patent Application Publication No. Hei16(2004)-228504 in which, by measuring the amount of clock delay of any clocks to the internal blocks by using the delay measurement circuit, then adjusting the amount of clock delay of any clocks by using the delay adjustment circuit (corresponding to the clock delay circuit) based on the measurement results, and storing the adjusted value in a nonvolatile memory, unexpected clock delay caused by the product dispersion in the manufacturing process can be compensated for.

SUMMARY

In the above described related art, if every macro included in a chip is subject to delay malfunction recovery, a nonvolatile memory circuit (fuse circuit) is needed for each macro for storing the information required for the recovery. This causes problems that the number of nonvolatile circuits will become enormous, the circuit size of the nonvolatile memory circuit occupying in a chip will become larger. There is a need for achieving a mechanism for recovery of delay malfunction of every macro without enlarging the size of the nonvolatile memory circuit.

According to an aspect of the present invention, a clock signal adjustment circuit for a semiconductor integrated circuit includes: multiple circuit blocks, each having a specific function block to be subject to the delay test; a clock tree buffer which distributes clock signals to the circuit blocks; multiple clock delay circuits which perform the delay process of supplying delayed clock signals to the corresponding circuit blocks by delaying the clock signals inputted from the clock tree buffer by a predetermined delay value based on a delay control signal; a control circuit which performs the delay test of the circuit blocks by the delay process performed on the circuit blocks by using the delay control signals to be set by using the setting signal from an external circuit; a recovery group memory circuit which stores the information on the circuit blocks requiring the delay process among the circuit blocks, in response to the result of the delay test; a predetermined number of delay setting circuits, the number of which is less than the number of the circuit blocks, and which store the delay value information on the circuit blocks requiring the delay process among the circuit blocks, in response to the result of the delay test; and a delay setting dispatch control circuit which dispatches the delay control signals, in correspondence with the delay value information stored in the delay setting circuit, for the clock delay circuits corresponding to the information on the circuit blocks stored in the recovery group memory circuit.

According to another aspect of the present invention, a control method of a clock signal adjustment circuit for a semiconductor integrated circuit, the clock signal adjustment circuit for the semiconductor integrated circuit having multiple circuit blocks each having a specific function block which is subject to the delay test; a clock tree buffer which distributes clock signals to the circuit blocks; multiple clock delay circuits which perform the delay process of supplying delayed clock signals to the corresponding circuit blocks by delaying the clock signals which are inputted from the clock tree buffer by the predetermined delay value based on a delay control signal; the controlling method includes:

performing a delay test on the circuit blocks by performing the delay process for the circuit blocks;

storing the information on the circuit blocks requiring the delay process among the circuit blocks in response to the result of the delay test and the corresponding delay value information; and dispatching the delay control signal based on the delay value information to the clock delay circuit corresponding to the stored information on the circuit blocks.

In accordance with the present invention, delay setting circuits each corresponding to multiple circuit blocks respectively are not required. By this a minimum set of delay setting circuits may recover the delay malfunction occurred on the circuit blocks requiring the delay process, allowing the enlargement of circuit size to be suppressed.

The present invention allows the enlargement of circuit size of a semiconductor integrated circuit to be suppressed.

BRIEF DESCRIPTION OF THE DRAWINGS

FIG. 6 is an exemplary tester result file in accordance with the preferred embodiment;

FIG. 7 is a flowchart illustrating the operation of the clock delay adjustment circuit in accordance with the preferred embodiment;

FIG. 8 is a flowchart illustrating the operation of the clock delay adjustment circuit in accordance with the preferred embodiment;

DETAILED DESCRIPTION

Figure 1:
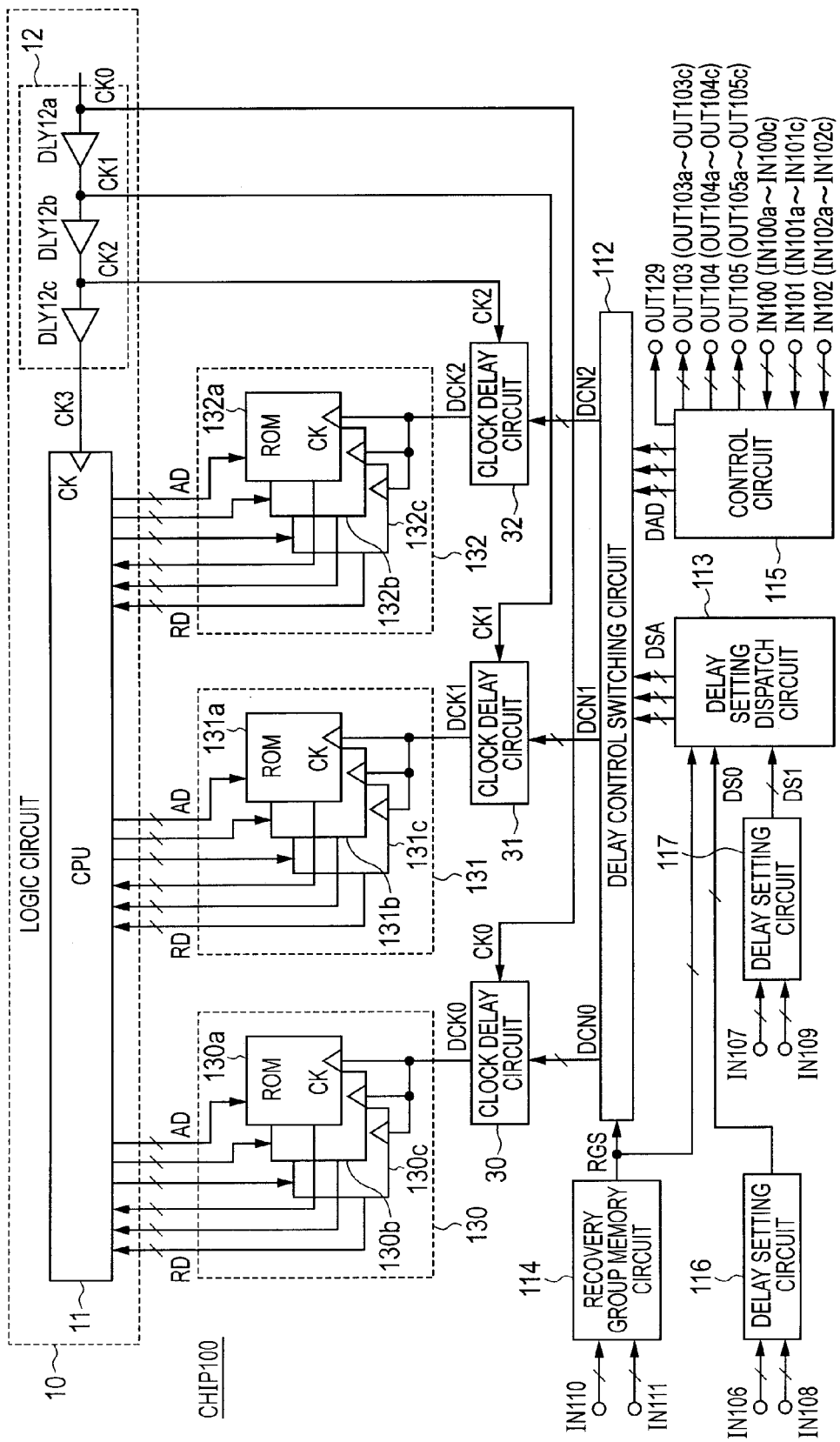
FIG. 1 is a schematic block diagram of an exemplary clock delay adjustment circuit in accordance with the preferred embodiment.

Now an embodiment in accordance with the present invention will be described in more details with reference to the accompanying drawings. The embodiment includes the present invention applied to a clock delay adjustment circuit of a semiconductor integrated circuit. FIG. 1 shows a schematic block diagram of the clock delay adjustment circuit CHIP 100 in accordance with the present invention.

The clock delay adjustment circuit CHIP 100 includes a logic circuit 10, macro groups 130, 131, and 132, clock delay circuits 30, 31, and 32, a delay control switching circuit 112, a delay setting dispatch circuit 113, a recovery group memory circuit 114, a control circuit 115, delay setting circuits 116 and 117. The delay control switching circuit 112 and the delay setting dispatch circuit 113 together form a delay setting dispatch control circuit.

The logic circuit 10 includes a specific circuit block such as the CPU 11, and a clock tree buffer 12. The clock tree buffer 12 in the example shown in FIG. 1 includes delay elements DLY12a-DLY12c.

The logic circuit 10 feeds the clock signal CK0, which is the base of the operation. The CK0 is phase-adjusted by the clock tree buffer 12 prior to providing to each circuit block including such as the CPU 11.

The delay elements DLY12a-DLY12c of the clock tree buffer 12 are connected in series. The delay element DLY12a outputs the clock signal CK1 which is a delayed version of the clock signal CK0 by a predetermined amount. The delay element DLY12b outputs the clock signal CK2 which is a delayed version of the clock signal CK1 by a predetermined amount. The delay element DLY12c outputs the clock signal CK3 which is a delayed version of the clock signal CK2 by a predetermined amount.

For example, assuming the circuit block 10 is a CPU (hereinafter, referred to as the CPU 11), the clock signal CK2 is supplied to the clock node C of the CPU 11 from the final output side of the clock tree buffer 12.

The macro groups 130, 131, and 132 each have a specific circuit block such as ROM. In the preferred embodiment of the present invention, the macro group 130 has ROMs 130a-130c. The macro group 131 has ROMs 131a-131c. The macro groups 132 have ROMs 132a-132c.

The macro groups 130, 131, and 132 each input/output data from/to the logic circuit 10. For example the ROM 130a stores the program to be executed by the CPU 11 and the static data, and it reads out the storage contents of the area specified by the address signal AD and outputs as the read data RD. The ROMs 130a-130c, 131a-131c, and 132a-132c included in the macro groups 130, 131, and 132 each have their proprietary address signal and read data RD.

The delay setting circuits 116 and 117 are equipped in the circuit, the number of which is equal to the macro groups required to be recovered from the malfunction of clock timings, and the number is less than the total number of macro groups. In the clock delay adjustment circuit CHIP 100 as shown in FIG. 1, there are two delay setting circuits(delay setting circuits 116 and 117) for three macro groups (macro groups 130, 131, and 132).

Figure 10:
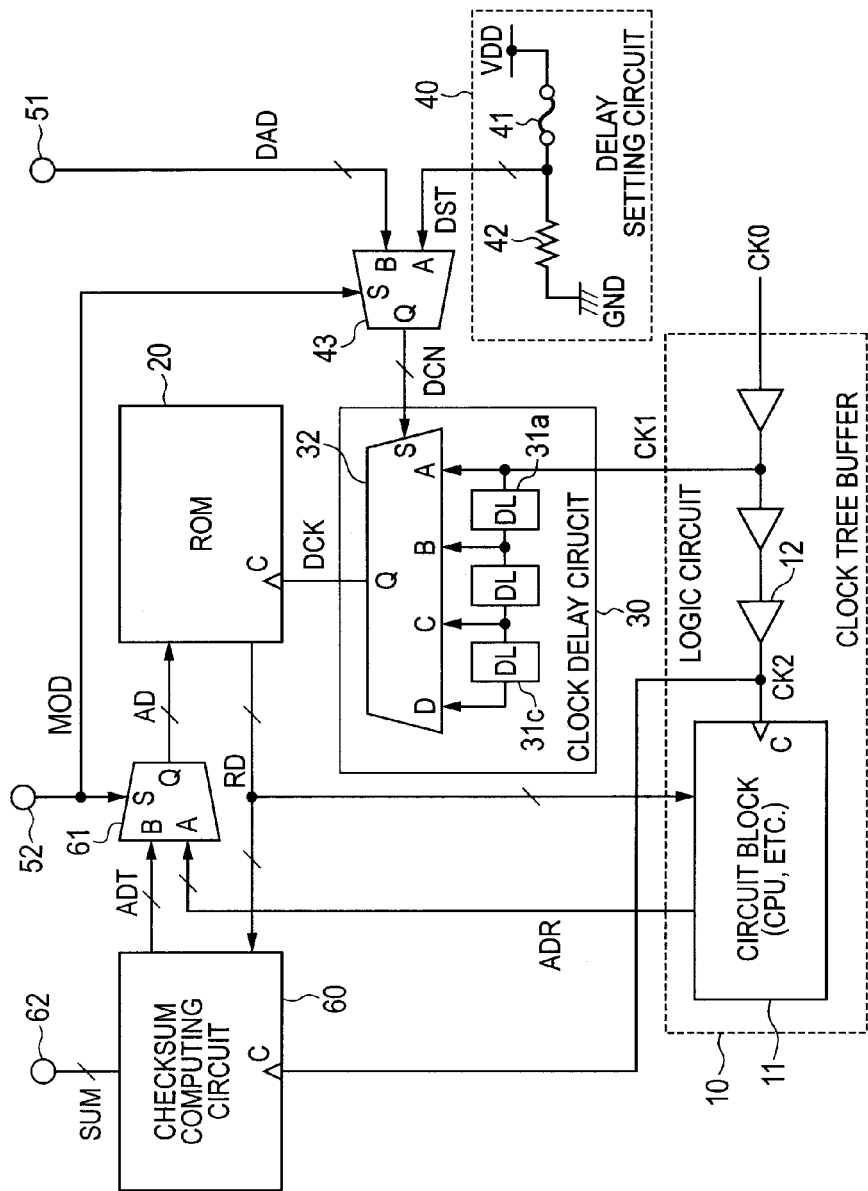
FIG. 10 is a schematic block diagram of a clock delay adjustment circuit in accordance with a related art.

The delay setting circuit 116 has the input nodes namely a delay setting control input node 106 and a delay setting value input node 108, and outputs a delay setting signal DS0 to the delay setting dispatch circuit 113. In the same manner, the delay setting circuit 117 has a delay setting control input node 107 and a delay setting value input node 109 as the input nodes, and outputs delay setting signal DS1 to the delay setting dispatch circuit 113. The delay setting control input nodes 106 and 107, and the delay setting value input nodes 108 and 109 are external terminals of the chip containing the semiconductor integrated circuit. The delay setting circuits 116 and 117 may also be nonvolatile memory circuits similar to the delay setting circuit 40 shown in FIG. 10. In other words, these circuits contain fuses therein and stores the information based on the cut/uncut status of the fuses.

The recovery group memory circuit 114 receives as inputs the recovery group setting control signal provided from the recovery group setting control input node 110, and the recovery group selection signal provided from the recovery group selection input node 111, and outputs recovery group setting signal RGS to the delay setting dispatch circuit 113 and the delay control switching circuit 112. The recovery group setting control input node 110 and the recovery group selection input node 111 are the external terminal of the chip containing the semiconductor integrated circuit.

The delay setting dispatch circuit 113 receives as inputs the delay setting signals DS0, DS1 which are output signals of the delay setting circuits 116 and 117, and the recovery group setting signal RGS which is the output of the recovery group memory circuit 114. The delay setting dispatch circuit 113 outputs the dispatch delay setting signals DSA0-DSA2 to the delay control switching circuit 112. The dispatch delay setting signals DSA0-DSA2 are signals corresponding to the macro groups 130-132, respectively. The dispatch delay setting signals DSA0-DSA2 are collectively referred to as the dispatch delay setting signal DSA according to the needs.

The control circuit 115 receives as inputs the clock delay initial value signal from the clock delay initial value input node IN100, the clock delay terminate value signal from the clock delay terminate value input node IN101, and pass/fail decision signal from the pass/fail decision input node IN102. The control circuit 115 outputs the clock delay upper limit value signal to the clock delay upper limit value output node OUT103, the clock delay lower limit value signal to the clock delay lower limit value output node OUT104, the recovery requirement signal to the recovery requirement output node OUT105, the recovery availability signal to the recovery availability output node OUT129.

The clock delay initial value input node IN100 includes clock delay initial value input nodes IN100a, IN100b, IN100c. The clock delay terminate value input node IN101 includes clock delay terminate value input nodes IN101a, IN101b, IN101c. The pass/fail decision input node IN102 includes pass/fail decision input nodes IN102a, IN102b, IN102c. The clock delay upper limit value output node OUT103 includes clock delay upper limit value output nodes OUT103a, OUT103b, OUT103c. The clock delay lower limit value output node OUT104 includes clock delay lower limit value output nodes OUT104a, OUT104b, OUT104c. The recovery requirement output node OUT105 includes recovery requirement output nodes OUT105a, OUT105b, and OUT105c.

The control circuit 115 further outputs delay adjustment signals DAD0-DAD2 to the delay control switching circuit 112. The delay adjustment signals DAD0-DAD2 are signals corresponding to the macro groups 130-132, respectively. The delay adjustment signals DAD0-DAD2 are collectively referred to as the delay adjustment signal DAD according to needs.

The clock delay initial value input node IN100 includes the clock delay initial value input nodes IN100a-IN100c. The clock delay initial value input nodes IN100a-IN100c are input nodes corresponding to the macro groups 130-132, respectively. In a similar manner, the clock delay terminate value input node IN101 includes the clock delay terminate value input nodes IN101a-IN101c. The clock delay terminate value input nodes IN101a-IN101c are input nodes corresponding to the macro groups 130-132, respectively.

The pass/fail decision input node IN102 includes the pass/fail decision input nodes IN102a-IN102c. The pass/fail decision input node IN102a-In102c are input nodes corresponding to the macro groups 130-132. Similarly, the clock delay upper limit value output node OUT103 includes clock delay upper limit value output nodes OUT103a-OUT103c. The clock delay upper limit value output nodes OUT103a-OUT103c are output nodes corresponding to the macro groups 130-132, respectively.

The clock delay lower limit value output node OUT104 includes the clock delay lower limit value output nodes OUT104a-OUT104c. The clock delay lower limit value output nodes OUT104a-OUT104c are output nodes corresponding to the macro groups 130-132, respectively. Similarly, the recovery requirement output node OUT105 includes the recovery requirement output nodes OUT105a-OUT105c. The recovery requirement output nodes OUT105a-OUT105c are output nodes corresponding to the macro groups 130-132, respectively.

The delay control switching circuit 112 receives as inputs the delay adjustment signals DAD0-DAD2, the dispatch delay setting signals DSA0-DSA2 which are output signals of the delay setting dispatch circuit 113, the recovery group setting signal RGS which is the output signal of the recovery group memory circuit 114. The delay control switching circuit 112 outputs the delay control signals DCN0-DCN2 to the clock delay circuits 30-32, respectively. The delay control signals DCN0-DCN2 are collectively referred to as the delay control signal DCN.

The clock delay circuits 30-32 receive the delay control signals DCN0-DCN2 and the clock signals CK0-CK2, respectively. The clock delay circuits 30-32 output their respective delay clock signals DCK0-DCK2. The delay clock signals DCK0-DCK2 are signals corresponding to the macro groups 130-132, respectively. The delay clock signals DCK0-DCK2 are collectively referred to as the delay clock signal DCK as need arises.

Figure 2:
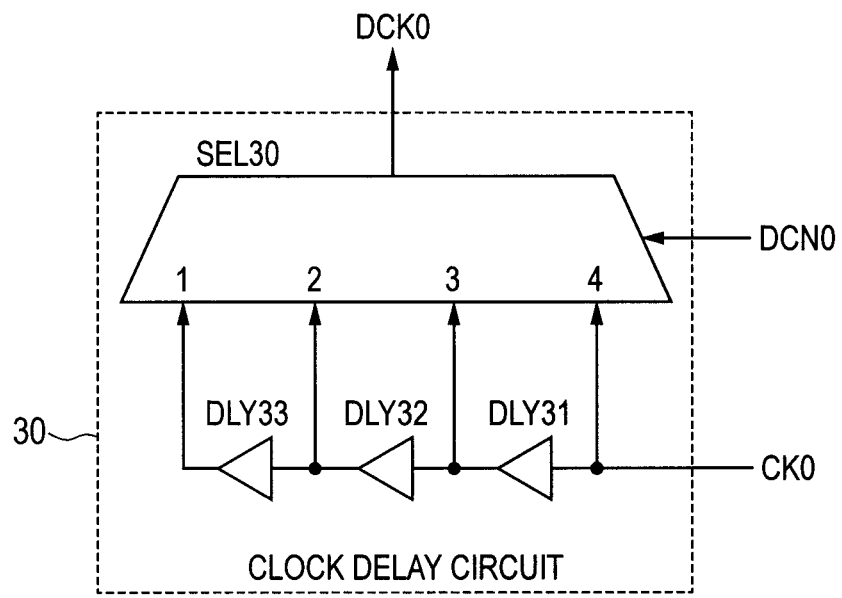
FIG. 2 is a schematic block diagram of a clock delay circuit in accordance with the preferred embodiment.

The clock delay circuits 30-32 will be described in greater details below. The clock delay circuits 30-32 have similar construction, and FIG. 2 describes only the clock delay circuit 30. The circuit construction is basically identical to the clock delay circuit 30 shown in FIG. 10. The clock delay circuit 30 includes the selector SEL30 and delay elements DLY31-DLY33.

The delay elements DLY31-DLY33 are connected in series. The delay element DLY31 receives as input the clock signal CK0, and outputs with a predetermined delay thereon.

The delay elements DLY32, DLY33, similarly, outputs the input signals with the predetermined delay thereon.

The selector SEL30 selectively outputs, in response to the delay control signal DCN0, one of followings: the clock signal CK0 or one of the output signals from the delay elements DLY31-DLY33.

As can be seen from the foregoing description, the clock delay circuits 30-32 are capable to output delayed signal of their respective input clock signal CK0-CK2 in response to the respective delay control signals DCN0-DCN2.

Figure 3:
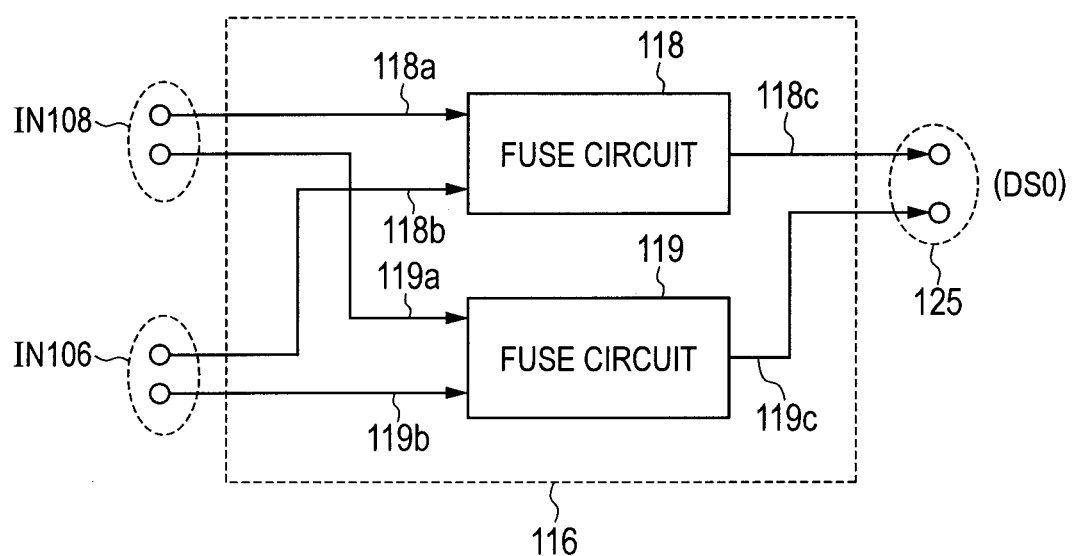
FIG. 3 is a schematic block diagram of a delay setting circuit in accordance with the preferred embodiment.

FIG. 3 shows an example of the delay setting circuit 116. Since the delay setting circuit 117 has the similar configuration to the delay setting circuit 116, the description thereof will be omitted herein.

In case in which the clock delay circuits 30-32 can adjust the amount of delay of their respective delayed clock signal DCK in K ways, the delay setting circuits 116, 117 respectively have fuse circuits the number of which is log 2(K) with decimal rounding. If K=4, then the number of fuse circuits will be 2, thus the delay setting circuit 116 as shown in FIG. 3 includes the fuse circuits 118, 119.

The fuse circuit 118 includes a value input node 118a and a value setting node 118b. The fuse circuit 119 includes a value input node 119a and a value setting node 119b. The fuse circuits 118, 119 stores the input values to the value input nodes 118a, 119a by inputting "0" or "1" to their respective value setting nodes 118b, 119b. In the following description the value input to the value input nodes 118a, 119a will be stored when the value setting nodes 118b, 119b receives "1".

The value input nodes 118a, 119a of the fuse circuits 118, 119 of the delay setting circuit 116 are coupled to the delay setting value input node 108. The value setting nodes 118b, 119b of the fuse circuits 118, 119 of the delay setting circuit 116 are coupled to the delay setting control input node 106. The signals output from the output nodes 118c, 119c of the fuse circuits 118, 119 of the delay setting circuit 116 are provided to the delay setting dispatch circuit 113 from the output node 125 of the delay setting circuit 116 as the delay setting signal DS0.

In a similar manner, the value input nodes 118a, 119a of the fuse circuits 118, 119 of the delay setting circuit 117 are coupled to the delay setting value input node 109. The value setting nodes 118b, 119b of the fuse circuits 118, 119 of the delay setting circuit 117 are coupled to the delay setting control input node 107. The signal output from the output nodes 118c, 119c of the fuse circuits 118, 119 of the delay setting circuit 117 will be outputted to the delay setting dispatch circuit 113 as the outputs delay setting signal DS1.

Figure 4:
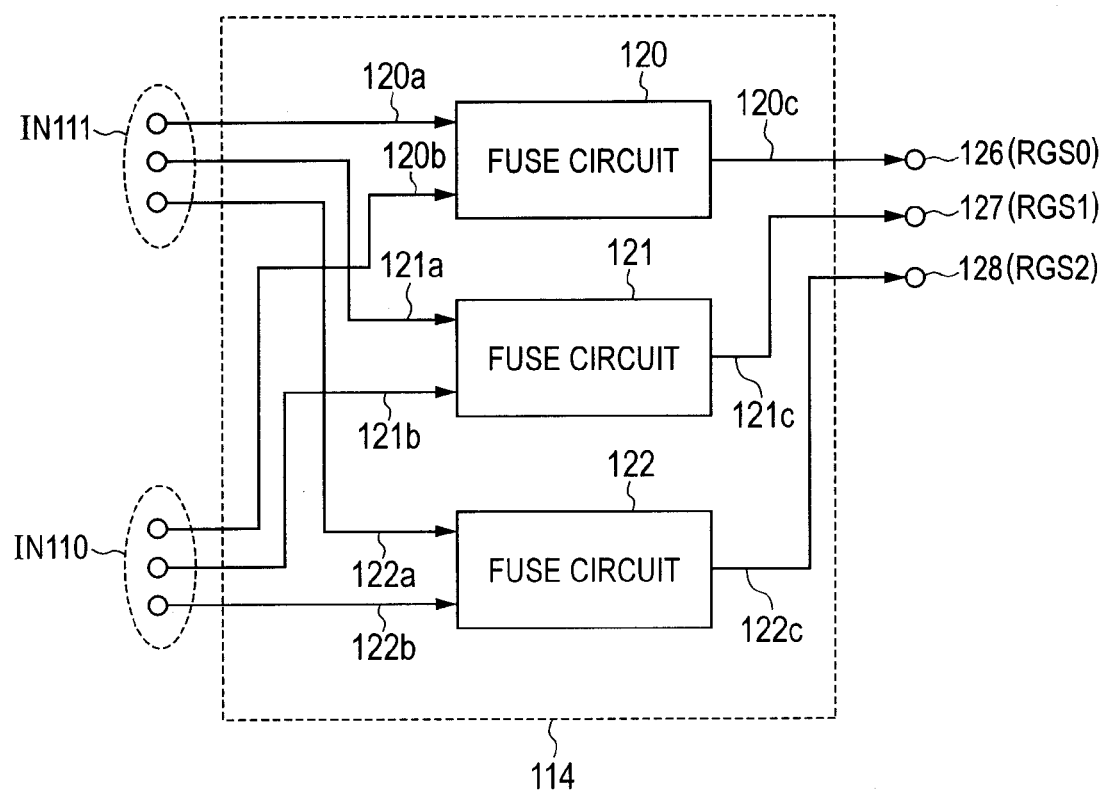
FIG. 4 is a schematic block diagram of a recovery group memory circuit in accordance with the preferred embodiment.

FIG. 4 shows an example of the recovery group memory circuit 114. The recovery group memory circuit 114 has fuse circuits 120, 121, and 122. The fuse circuits 120, 121, and 122 are corresponding to the macro groups 130, 131, and 132.

The value input nodes 120a-122a respectively of the fuse circuits 120, 121, and 122 are coupled to the recovery group selection input node 111. The value setting nodes 120b-122b respectively of the fuse circuits 120, 121, and 122 are coupled to the recovery group setting control input node 110. The signal output from the respective output nodes 120c-122c of the fuse circuits 120, 121, and 122 is provided to the delay setting dispatch circuit 113 and the delay control switching circuit 112 as the recovery group setting signal RGS.

The CPU 11 is assumed to have logic circuits on the input/output path when function is operating of the ROMs 130a-130c, 131a-131c, and 132a-132c. The CPU 11 also has a test circuit for performing the delay failure test of the ROMs 130a-130c, 131a-131c, and 132a-132c. The ROMs 130a-130c, 131a-131c, and 132a-132c respectively have the function similar to the ROM 20 of FIG. 10. The clock delay circuits 30-32 also have the similar function to the clock delay circuit 30 in FIG. 10.

It should be noted here that the clock delay circuits 30-32 shown in FIG. 1 are coupled each to plural ROMs through the clock signal line, the circuits may also be coupled to a single ROM. The circuit to be coupled may not be limited to the ROM, but may be coupled to any generic macros in condition that the delay malfunction test can be performed. A collection of all macros connected through the clock signal line to one clock delay circuit (namely, the macro groups 130-132) are subject to the delay malfunction test and failure recovery. The output clock signal lines of the clock delay circuits 30-32 are coupled only to the input of clock signals of the all macros included in their corresponding macro groups.

Figure 5:
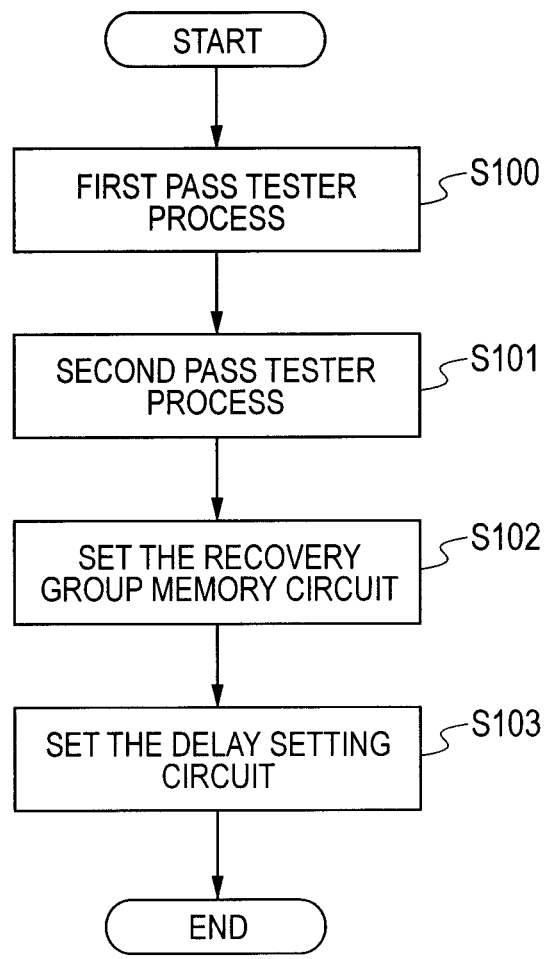
FIG. 5 is a flowchart illustrating the operation of the clock delay adjustment circuit in accordance with the preferred embodiment.

Now the operation of the clock delay adjustment circuit CHIP 100 in accordance with the preferred embodiment will be described in greater details. FIG. 5 shows a flowchart illustrating the operation of the clock delay adjustment circuit CHIP 100. The flowchart shown in FIG. 5 depicts the operation flow applied to a wafer on which many chips of the clock delay adjustment circuit CHIP 100 (referred to as simply "chip" hereinafter when needed) are formed.

The wafer test may comprise for example a high temperature test and a low temperature test with a respective dedicated tester. In the description these tests are referred to as first pass tester process, second pass, and so on in order not to consider the order of the tests.

As shown in FIG. 5, first pass tester process is performed (S100). The result of the first pass tester process is stored by the tester program as a file in the tester. This file is called as first pass tester result file. An example of the first pass tester result file is shown in FIG. 6. In the first pass tester result file shown in FIG. 6, as an example, N semiconductor integrated circuit chips exists on one single wafer, each chip contains three (3) macro groups. In the first pass tester result file shown in FIG. 6 for each chip there is marked as recoverable or not recoverable, and for each chip the clock delay lower limit value, clock delay upper limit value, whether the recovery is needed or not are described for all macro groups.

Next, the first pass tester result file is inputted to the tester to perform second pass tester process (S101). The result of the second pass tester process is stored by the tester program as a file in the tester. This file is called as second pass tester result file. The second pass tester result file is described in a similar manner as that shown in FIG. 6.

Next, by referring to the information about whether recoverable or not for each chip, recorded in the second pass tester result file obtained in the step S101, the recovery group setting process is performed for only the chips which are recoverable (S102). In the recovery group setting process of the step S102, the following operation will be performed.

At first, the tester program determines whether each of macro groups 130-132 described in second pass tester result file requires recovery operation or not.

In accordance with the decision, the recovery group memory circuit 114 enters the signal indicating the macro groups to be recovered (referred to as recovery group hereinafter) through the recovery group selection input node 111. In addition, it enters the fuse melt-down control signal through the recovery group setting control input node 110.

By this, the signal indicating the recovery group which is entered from the recovery group selection input node 111 is stored in the fuse circuits 120, 121, and 122 of the recovery group memory circuit 114, the information on the recovery groups is stored even when the power of the entire chip is shut down. The setting value stored in the fuse circuits 120-122 will be outputted as the recovery group setting signal RGS from the selection group output nodes 126-128 shown in FIG. 4.

For example, when the macro groups 130 and 132 are recovered, "1" is entered to the recovery group selection input node 111 coupled to the fuse circuits 120 and 122. Also, "0" is entered to the recovery group selection input node 111 coupled to the fuse circuit 121. Then "1" is entered to all recovery group setting control input nodes 110, the circuit stores that the recovery groups are macro groups 130 and 132. As a result, the recovery group setting signal RGS="101" is provided.

The recovery group memory circuit 114 shown in FIG. 4 includes fuse circuits 120-122 corresponding to the macro groups 130-132. In other words the recovery group memory circuit 114 requires the fuse circuits 120-122 of the number of the macro groups. However, the required number of circuits may also be the number of bits which presents all combination of the recovery groups as will be described later.

For example, now consider that there are five (5) macro groups and two (2) recovery groups. In this case the recovery group memory circuit 114 may only be required to store sixteen (16) output status in total, consisted of "00000", "00001", "00010", "00100", "01000", "10000", "00011", "00110", "01100", "11000", "00101", "01010", "10100", "01001", "10010" and "10001". This indicates that in the recovery group memory circuit 114 four (4) fuse circuits need to be provided. In this case, a decoder circuit must however be provided.

The recovery group memory circuit 114, after storing the recovery group as described above, will output the recovery group setting signal RGS to the delay control switching circuit 112 and the delay setting dispatch circuit 113.

The delay setting dispatch circuit 113 responds to the recovery group setting signal RGS to assign the delay setting signals DS0 and DS1, which are setting values for the delay setting circuits 116, 117, to the dispatch delay setting signal DSA output port of the corresponding macro groups to output to the delay control switching circuit 112. In this case the assuming that the macro groups 130-132 are provided with their identification number "0", "1", and "2". The delay setting circuits 116, 117 also are provided with another identification number "0" and "1".

The delay setting dispatch circuit 113 dispatches the dispatch delay setting signal DSA output port (DSA0, DSA1, DSA2) in the ascending order of the identification number of the corresponding macro groups to the delay setting signal of the delay setting circuit having a smaller identification number.

For example, if the recovery group is only the macro group 130, then in accordance with the operation as described above the recovery group memory circuit 114 outputs the recovery group setting signal RGS="100". In this case in the delay setting dispatch circuit 113 the delay setting signal DS0 by the delay setting circuit 116 which has the identification number "0" outputs to the dispatch delay setting signal DSA0 corresponding to the macro group 130 which has the identification number "0". For the dispatch delay setting signals DSA1 and DSA2 corresponding to other macro groups, any arbitrary value may be outputted.

As another example, if the recovery group is the macro groups 130 and 132, then the recovery group memory circuit 114 outputs the recovery group setting signal RGS="101". In this case the delay setting dispatch circuit 113 outputs the delay setting signal DS0 by the delay setting circuit 116 which has the identification number "0" to the dispatch delay setting signal DSA0 corresponding to the macro group 130 which has the identification number "0", and outputs the delay setting signal DS1 by the delay setting circuit 117 which has the identification number "1" to the dispatch delay setting signal DSA2 corresponding to the macro group 132 which has the identification number "2." For the dispatch delay setting signal DSA1 corresponding to the macro group 131, any arbitrary value may be outputted.

Next, the delay control switching circuit 112 responds to the recovery group setting signal RGS to switch the delay control signal DCN0, DCN1, and DCN2 each corresponding to the clock delay circuits 30, 31, and 32 to either the delay adjustment signals DAD0, DAD1, DAD2 or to the dispatch delay setting signals DSA0, DSA1, and DSA2. The delay control signals DCN0, DCN1, and DCN2 each correspond to the delay adjustment signals DAD0, DAD1, and DAD2 outputted from the control circuit 115. In a similar manner, the delay control signals DCN0, DCN1, and DCN2 each correspond to the dispatch delay setting signals DSA0, DSA1, and DSA2 respectively outputted from the delay setting dispatch circuit 113. The delay control signals DCN0, DCN1, and DCN2 controls the amount of delay for the clock delay circuits 30, 31, and 32.

The delay setting dispatch circuit 113 and the delay control switching circuit 112 operate such that the dispatch delay setting signal DSA is outputted to the delay control signal DCN corresponding to the recovery group, and the delay adjustment signal DAD is outputted to the delay control signal DCN corresponding to the macro group which will not be recovered.

The control circuit 115 outputs a fixed value to every delay adjustment signal DAD. The recovery group memory circuit 114 in this case is not set yet. Therefore the delay control switching circuit 112 outputs the delay adjustment signal DAD for the delay control signal DCN. For this reason, in the design step of a chip, the amount of the clock delay of all clock delay circuits 30, 31, and 32 are designed as fixed, due to the delay adjustment signal DAD with a fixed value output from the control circuit 115.

Next, by referring to the information about whether or not recoverable for each chip, described in the second pass tester result file obtained in the step S101, a delay setting process will be performed for the recoverable chip (S103). In the delay setting process the tester program determines the clock delay setting value for each recoverable group from the valid setting range of each recoverable group described in the second pass tester result file. For example, the median may be determined for the delay setting value. Then, this setting value is entered to the delay setting value input nodes 108 and 109 of the corresponding delay setting circuits 116, and 117. In addition, the delay setting control signal is inputted from the delay setting control input nodes 106 and 107 to store the clock delay value for the recoverable group.

A more specific example of the operation in the delay setting circuit 116 in FIG. 3 will be described below. At first, a delay value desired to be set is inputted from the delay setting value input node 108. Next, "1" is inputted to the delay setting control input node 123 to perform cut of the fuse circuits 118 and 119. Thereafter, the setting values are stored even if the power of the chip is shut down, and the stored setting value is outputted from the delay setting value output node 125 as the delay setting signal DS0. The delay setting circuit 117 will perform similar operations to store the setting value and to output the delay setting signal DS1 from the delay setting value output node 125 of the delay setting circuit 117.

The operation of the delay setting signal DS0 will be described below by using a more specific value. As the prerequisite, the macro group corresponding to the delay setting circuit 116 is assumed to be the macro group 130. The clock delay circuit 30 is configurable with the pattern "00" of the delay control signal DCN0, that the amount of delay of the delay clock signal DCK0 is 1.0 ns, with "01" the amount is 1.1 ns, with "10" 1.2 ns, and with "11" 1.3 ns.

In this situation, in order to set the amount of delay of the delay clock signal DCK0 to 1.2 ns, "1" is inputted to the delay setting value input node 108 corresponding to the fuse circuit 118, and "0" to the delay setting value input node 108 corresponding to the fuse circuit 119. Next, by inputting "11" to the delay setting control input node 106, the input values to the delay setting value input node 108 will be stored. Thereafter, the setting values are stored even if the power to the chip is shut down, and "10" will be outputted from the delay setting value output node 125.

FIG. 7 shows a flowchart of the first pass tester process. Using the flowchart shown in FIG. 7, the operation of first pass tester processing the step S100 of FIG. 5 will be described below.

At first, the test program of the tester directs the control circuit 115 to input, as the initial values, the minimum adjustable values in the clock delay circuits 30, 31, and 32 corresponding to the respective macro groups 130, 131, and 132, from the clock delay initial value input nodes IN100a, IN100b, and IN100c. In a similar manner, the maximum and adjustable value in the clock delay circuits 30, 31, and 32 corresponding to the respective macro groups 130, 131, and 132, will be inputted as the clock delay terminate value, from the clock delay initial value input nodes IN101a, IN101b, and IN101c (S110).

Next, the tester program directs the clock delay adjustment circuit CHIP 100 to perform the delay adjustment process (S111). In this step S111 the clock delay circuits 30-32 gradually increment the clock delay value for the corresponding the macro groups 130-132, from the clock delay initial value to the clock delay terminate value, which are set in the previous step S110. Then a delay malfunction test in correspondence with the respective clock delay values is conducted for the macro groups 130-132.

Next, in step S111, the clock delay lower limit value and the clock delay upper limit value for the macro groups 130-132 are determined, and thus the measurement result is taken as the valid setting range, the tester program of the tester will obtain the result of the delay adjustment process from the control circuit 115 (S112). The clock delay lower limit value for each macro group is outputted from the clock delay lower limit value output node OUT104a, OUT104b, and OUT104c. The clock delay upper limit value for each macro group is outputted from the clock delay upper limit value output node OUT103a, OUT103b, and OUT103c.

The decision result of whether recovery is required for the macro groups 130, 131, and 132 can be obtained from the recovery requirement output node OUT105a, OUT105b, and OUT105c, and the decision result of whether the currently processing chip is recoverable or not can be obtained from the recovery availability output node OUT129.

If the process is not concluded for every clock delay adjustment circuit CHIP 100 on the wafer (S113: NO), then the processes of the steps S110-S112 will be performed for any other clock delay adjustment circuit CHIP 100. If the process is concluded for every clock delay adjustment circuit CHIP 100 on the wafer (S113: YES), then the status recoverable or not in every chips, the clock delay lower limit value for each macro group, the clock delay upper limit value for each macro group, the recovery requirement for each macro group are stored by the tester program in the first pass tester result file, and the first pass tester process terminates.

FIG. 8 shows a flowchart of the second pass tester process. Using the flowchart of FIG. 8, the operation of the second pass tester process in the step S101 of FIG. 5 will be described in greater details.

At first, the test program of the tester directs the control circuit 115 to enter the clock delay lower limit value of all macro groups 130, 131, and 132, described in the first pass tester result file, of the chip in processing through the clock delay initial value input node IN100a, IN100b, and IN100c. In a similar manner for the clock delay terminate value, the clock delay upper limit value of all macro groups 130, 131, and 132, described in the first pass tester result file, of the chip in processing is inputted through the clock delay terminate value input node IN101a, IN101b, and IN101c (S120).

Next, the tester program direct the clock delay adjustment circuit CHIP 100 to perform the delay adjustment process (S121). In this step S121, the clock delay circuits 30-32 gradually increment the clock delay values from the clock delay initial value to the clock delay terminate value, both set in the step S120, for the corresponding macro groups 130-132. Then the delay malfunction test of each clock delay value is performed on each of macro groups 130-132.

Next, in the step S121, the clock delay lower limit value and the clock delay upper limit value for each of the macro groups 130-132 will be determined, and the decision result is used for the available setting range, the tester program of the tester will obtain as the results of the delay adjustment process from the control circuit 115. The clock delay lower limit values for each macro group are outputted from the clock delay lower limit value output nodes OUT104a, OUT104b, and OUT104c. The clock delay upper limit values for each macro group are outputted from the clock delay upper limit output node OUT103a, OUT103b, and OUT103c.

The determination of whether each of macro groups 130, 131, and 132 requires recovery or not can be obtained from the recovery requirement output nodes OUT105a, OUT105b, OUT105c, and the determination of whether the chip in processing is recoverable or not can be obtained from the recovery availability output node OUT129.

If the above process is not concluded for every clock delay adjustment circuits CHIP 100 on the wafer (S123: NO), then the process of the step S120-S122 will be performed for the any other remaining clock delay adjustment circuit CHIP 100. Then, if the above process is concluded for every clock delay adjustment circuit CHIP 100 on the wafer (S123: YES), then the status recoverable or not in every chips, the clock delay lower limit value for each macro group, the clock delay upper limit value for each macro group, the recovery requirement for each macro group are stored by the tester program in the second pass tester result file, and the second pass tester process terminates.

Figure 9:
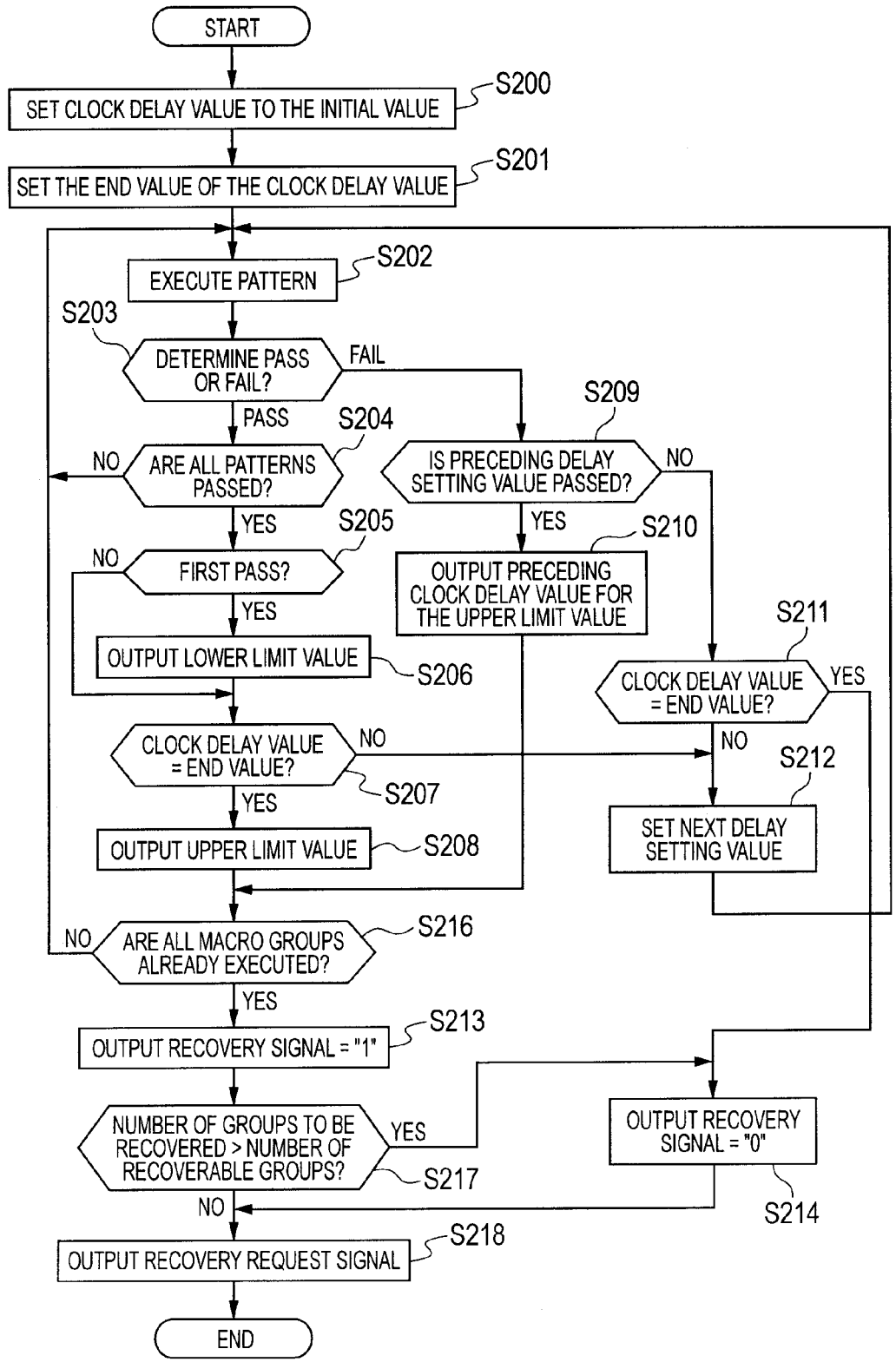
FIG. 9 is a flowchart illustrating the operation of the clock delay adjustment circuit in accordance with the preferred embodiment.

FIG. 9 shows a flowchart of the delay adjustment process of the steps S111 and S121 of the first and second tester process. Using the flowchart of FIG. 9, the operation of the delay adjustment process will be described in greater details herein below.

The control circuit 115 sets the initial values of the clock delay value for each of the macro groups 130, 131, and 132 based on the input information from the clock delay initial value input nodes IN100a, IN100b, and In100c (S200). The initial values are set by the delay adjustment signal DAD0 for the macro group 130, by the delay adjustment signal DAD1 for the macro group 131, and the delay adjustment signal DAD2 for the macro group 132.

Until the storage process of the recovery group memory circuit 114 is conducted, the delay adjustment signals DAD0, DAD1, and DAD2 by the control circuit 115 are provided for the delay control signals DCN0, DCN1, and DCN2 which are the outputs of the delay control switching circuit 112. Because of this, in the flowchart of the delay adjustment process, the amount of the delay for the clock delay circuits 30, 31, and 32 are controlled by the control circuit 115 all the time.

Next, the control circuit 115, based on the information of the input of the clock delay terminate value input nodes IN101a, IN101b, and IN101c, sets the terminate value of the clock delay values for each of the macro groups 130, 131, and 132 (S201).

Then, the test circuit contained in the CPU 11 executes one delay malfunction test pattern which is not executed in the current clock delay setting value (S202). The test circuit in the CPU 11 outputs the pass/fail decision signal which is the result of execution of each test pattern, then the signal is inputted to the pass/fail decision input node IN102 of the control circuit 115 corresponding to the macro group. If the estimate value matching of the test pattern is performed external to the chip, the pass/fail decision input node IN102 may be chip external terminals.

The control circuit 115 receives the pass/fail decision result for the delay malfunction test pattern executed in the step S202 through the Pass/Fail Decision Input Node IN102. If the decision result indicates "pass" (S203: PASS), then the process proceeds to the step S204.

In step S204 the control circuit 115 determines whether every delay malfunction test patterns are passed, and if all delay malfunction test pattern are passed (S204: YES), then the process proceeds to the step S205. If there is a delay malfunction test pattern not yet executed (S204: NO), then the process proceeds back to the step S202.

In the step S204 above, if all delay malfunction test patterns are passed (S204: YES), then the control circuit 115 determines whether or not this is the first time for the current clock delay setting value to pass these all delay malfunction test patterns (S205). If this is the first time (S205: YES), then the control circuit 115 uses the current clock delay setting value for the clock delay lower limit value of the macro groups currently in processing and outputs from the clock delay lower limit value output node OUT104 of the corresponding macro group (S206).

The clock delay circuits 30, 31, and 32 determines the amount of delays of the delayed clock signal DCK to be outputted by the values of the respective delay control signals DCN0, DCN1, and DCN2. However, before setting the recovery group memory circuit 114 in the step S102 of FIG. 5, the delay adjustment signals DAD0, DAD1, and DAD2, which have been output from the control circuit 115, will be outputted from the delay control switching circuit 112 as the respective delay control signals DCN0, DCN1, and DCN2. Because of this, the amount of delay of the delayed clock signal DCK of the clock delay circuits 30, 31, and 32 will be determined by their respective delay adjustment signals DAD0, DAD1, and DAD2. This means that the clock delay value of each macro group will be controlled by the control circuit 115.

At the time when the control circuit 115 adjusts the amount of delay of the delayed clock signal DCK of the clock delay circuits 30, 31, and 32, the clock delay setting value which achieves a clock delay value less than the current clock delay value by one step among the adjustable clock delay values in the clock delay circuits corresponding to the macro groups in one chip, will be referred to as a prior delay setting value herein below.

In the step S205, if this is not the first time that all delay malfunction test patterns are passed by the current clock delay setting value (S205: NO), that is, all the delay malfunction test patterns have been passed by the prior delay setting value as well, then the step S206 will not be executed and the clock delay lower limit value will not be outputted.

Next the control circuit 115 determines whether the current clock delay setting value is the last one or not (S207). If this is the last value (S207—YES), then the current clock delay setting value will be used for the clock delay upper limit value of the currently processing macro group by the control circuit 115 to output from the clock delay upper limit value output node OUT103 of the corresponding macro group (S208).

If this is not the last value (S207: NO), then the control circuit 115 sets the clock delay setting value to the next delay setting value (S212) and the process proceeds to the step S202.

In the step S203, if a delay malfunction test pattern is failed, the control circuit 115 will determine if in the prior delay setting value, all of the delay malfunction test patterns are passed or not (S209). If all passed (S209: YES), then the control circuit 115 will use the prior delay setting value for the clock delay upper limit value of the currently processing macro group to output from the clock delay upper limit value output node OUT103 of the corresponding macro group, and the process proceeds to the step S216.

In the step S209, if in the prior delay setting value a delay malfunction test pattern has been failed, or the current clock delay setting value is the initial value (S209: NO), then the control circuit 115 will determine whether or not the current clock delay setting value is the terminate value (S211). If this is the terminate value (S211: YES), then all precedent clock delay setting values have been failed. Because of this the control circuit 115 will output in the step S214 the recovery availability signal="0" from the recovery availability output node OUT129 (S214). If this is not the terminate value (S211—NO) then the control circuit 115 will set the clock delay setting value to the next delay setting value (S212), and the process proceeds to the step S202.

If all of the above steps S202 to S212 are not executed for every macro groups 130-132 of each chip (S216: NO), then the above steps S202 to S212 will be executed for the macro groups to which the steps have not been executed.

If all of the above steps S202 to S212 have been executed for every macro groups 130-132 of each chip (S216: YES), then the control circuit 115 will output the recovery availability signal="1" from the recovery availability output node OUT129 (S213).

Next, the number of macro groups which require the recovery (recovery group) will be determined, and if the number is larger than the predetermined recoverable number (=the number of the delay setting circuits 116, 117) (S217: YES), then the process proceeds to step S214 where the control circuit 115 will output the recovery availability signal="0" through the recovery availability output node OUT129 (S214).

On the other hand, if the number of macro groups requiring the recovery is equal to or less than the recoverable number (S217: NO), then the control circuit 115 will determine whether the recovery will be required or not for each macro groups 130-132 at the termination of wafer test, and will output the recovery requirement signals of the corresponding macro groups 130, 131, and 132 through their respective recovery requirement output nodes OUT105a, OUT105b, and OUT105c, which are the chip external terminals (S218).

For example, it will output "1" when the recovery is required, or "0" when the recovery is not required.

The determination whether or not the recovery is required for the macro groups 130-132, will be decided by whether or not the delay adjustment signal DAD of a fixed value, which has been used in the designing stage, is included within the respective valid setting range. For example, if, at the end of second pass tester process, the recovery availability signal="1" of a chip, the macro groups are recoverable since for the macro groups which correspond to the recovery requirement signal="1", the valid setting range of the clock delay values in which all delay malfunction test patterns are passed in both the first and second tester processes have been obtained from the clock delay upper limit value output node OUT103 and the clock delay lower limit value output node OUT104.

The pattern execution in the step S202 is available, for example by dividing the scanning chain to each of macro groups 130-132, and by generating in advance in the design stage the pattern and expectation values which have a higher delay malfunction detection rate, the comparison of the expectation value itself will be executed by the tester program external to the chip.

The present invention incorporates the recovery group memory circuit 114, and the delay setting dispatch circuit 113 coupled between the delay setting circuits 116 and 117 and the delay control switching circuit 112. The delay setting circuits 116 and 117 equipped for the number of macro groups 130-132 requiring the recovery will be dispatched to the recovery group. By doing this a less number of nonvolatile memory circuit can be used for the delay malfunction recovery of all of the macros contained in a chip.

A more specific example of a chip containing 500 macro groups will be used for the description. In this example, the surface area of the delay setting circuits and the recovery group memory circuits are assumed to be 400 [$\mu m^2$/bit]. The delay setting circuits are assumed to have 5 [bits]. The probability that a delay malfunction occurs in each macro group is assumed to be 0.0005 (=0.05%), and the target yield is assumed to be 99%.

In case in which all macro groups contained in a chip are subject to the recovery, a clock delay circuit is needed for each macro group. In the related art, one delay setting circuit for maintaining the setting value for the clock delay circuit has been required for each of the clock delay circuits. For the entire delay setting circuits, the surface area S1 of the nonvolatile memory circuit (fuse circuit) can be given by the following equation (1):

$$S1 = (\text{surface area of the delay setting circuit}) \times (\text{number of bits}) \times (\text{number of macros}) \quad (1)$$

By substituting values expected as above for items in the equation (1), the equation (2) as follows can be obtained:

$$S1 = 400 \, [\mu m^2/\text{bit}] \times 5 \, [\text{bit}] \times 500 \quad (2)$$
$$= 1{,}000{,}000 \, [\mu m^2]$$

In case of the present invention, although similar to the related art a clock delay circuit is required for each of the macro groups, it is sufficient to have the number of delay setting circuits as determined below. At first, the probability P(n), the occurrence of the delay malfunction in n macro groups, can be given by the following equation (3):

$$P(n) = 0.0005^n \times (1 - 0.0005)^{(500-n)} \times C(500, n) \quad (3)$$

where C(m, n) is a combination of extracting a number n from a number m. From the equation (3),

P(0)=77.88%

P(1)=19.48%

P(2)=2.43%

Therefore, $$P(0)+P(1)=97.35\% \qquad (4)$$

$$P(0)+P(1)+P(2)=99.78\% \qquad (5)$$

Since the expected yield is 99%, the following equation (6) may be given from the above equations (4) and (5):

$$P(0)+P(1)<99\%<P(0)+P(1)+P(2) \qquad (6)$$

From the equation (6), the expected yield of 99% is achievable if at most 2 macro groups can be recovered. Thereby the S2, the surface area of the nonvolatile memory circuit in accordance with the present invention, can be given by the following equation (7)

$$S2 = \text{(surface area of the delay setting circuit)} + \text{(surface area of the recovery group memory circuit)} \qquad (7)$$

By substituting values as expected for the items in the equation (7), the following equation (8) can be given:

$$S2 = 400 \,[\mu m^2/bit] \times 5 \,[bit] \times 2 + 400 \,[\mu m^2/bit] \times 500 \,[bit] \qquad (8)$$
$$= 204{,}000 \,[\mu m^2]$$

The ratio of the S1, the surface area of the nonvolatile memory circuits according to the related art with the S2, the surface area of the nonvolatile memory circuits in accordance with the present invention, can be given by the following equation (9):

$$S1{:}S2=1{,}000{,}000{:}204{,}000 \qquad (9)$$

As can be appreciated from the foregoing description, as given by the equation (9), in the present invention, the surface area of the nonvolatile memory circuit can be reduced to 20.4% of the related art. As a result, in accordance with the present invention, when compared to the related art, the delay malfunction of every macros contained in a chip can be recovered by using less nonvolatile memory circuits. This is achieved because the recovery group memory circuit stores the macro groups requiring the recovery, and the delay setting dispatch circuit dispatches the delay setting circuit equipped by the number required for the recovery of the macro groups to the macro groups.

The present invention is not limited to the preferred embodiment as above described, and many modifications and changes can be applied thereto without departing from the spirit of the present invention.

What is claimed is:

1. A clock signal adjustment circuit for a semiconductor integrated circuit comprising:
    a plurality of circuit blocks each including specific functional blocks to be subject to a delay test;
    a clock tree buffer which distributes clock signals to the circuit blocks;
    a plurality of clock delay circuits which perform the delay process by delaying the clock signal input from the clock tree buffer by a delay value based on the delay control signal, then by supplying the delayed clock signal to its corresponding circuit blocks;
    a control circuit which performs the delay test of the circuit blocks by performing the delay process on the circuit blocks based on the delay control signal which is set by an external setting signal;
    a recovery group memory circuit which stores the information about the circuit blocks requiring the delay process among the circuit blocks, in response to the result of the delay test;
    a predetermined number of delay setting circuits which are less than the number of the circuit blocks, and which store the information about the delay value of the circuit blocks requiring the delay process among the circuit blocks, in response to the result of the delay test; and
    a delay setting dispatch control circuit which dispatches the delay control signal in correspondence with the information about the delay value stored in the delay setting circuit to the clock delay circuit corresponding to the information about the circuit blocks stored in the recovery group memory circuit.

2. The clock signal adjustment circuit for the semiconductor integrated circuit according to claim 1,
    wherein the predetermined number of the delay setting circuits is determined in accordance with the probability of the occurrence of the delay malfunction in the circuit blocks.

3. The clock signal adjustment circuit for the semiconductor integrated circuit according to claim 1,
    wherein the recovery group memory circuit includes a first nonvolatile memory element for each of the circuit blocks, and writes the information to the first nonvolatile memory element corresponding to a circuit block requiring the delay process, in response to the result of the delay test.

4. The clock signal adjustment circuit for the semiconductor integrated circuit according to claim 3,
    wherein information is written in the first nonvolatile memory element corresponding to the circuit block requiring the delay process, by cutting a fuse.

5. The clock signal adjustment circuit for the semiconductor integrated circuit according to claim 1,
    wherein the delay setting circuit includes second nonvolatile memory elements the number of which is in correspondence with the steps of delay for delaying the clock signal input of the clock delay circuit.

6. The clock signal adjustment circuit for the semiconductor integrated circuit according to claim 1,
    wherein the recovery group memory circuit includes first nonvolatile memory elements the number of which is determined by the number of combinations by the predetermined number of the delay setting circuits determined in correspondence with the probability of the occurrence of a delay malfunction in the circuit blocks, and by the number of the circuit blocks.

7. The clock signal adjustment circuit for the semiconductor integrated circuit according to claim 1,
    wherein a delay setting dispatch control circuit comprises a delay setting dispatch circuit and a delay control switching circuit;
    wherein the predetermined number of delay setting circuits outputs the information stored by each circuit about the delay value of the circuit blocks requiring the delay process as the delay setting signal;
    wherein the delay setting dispatch circuit dispatches the delay setting signal output from the delay setting circuit in correspondence with the information stored by the recovery group memory circuit about the circuit block requiring the delay process, and outputs as the dispatched delay setting signal; and wherein the delay control switching circuit outputs the dispatched delay setting signal as the delay control signal, in correspondence with the information stored by the recovery group memory circuit about the circuit blocks requiring the delay process, to the clock delay circuit corresponding to the circuit block requiring the delay process.

8. The clock signal adjustment circuit for a semiconductor integrated circuit according to claim 7, wherein the control circuit outputs the delay adjustment signal for the delay test for performing the delay process on the circuit blocks in correspondence with the external setting signal; and wherein the delay control switching circuit outputs the delay adjustment signal as the delay control signal in the delay test.

* * * * *